United States Patent [19]
Balsells

[11] Patent Number: 4,934,666
[45] Date of Patent: Jun. 19, 1990

[54] COILED SPRING ELECTROMAGNETIC SHIELDING GASKET

[75] Inventor: Peter J. Balsells, P.O. Box 15092, Santa Ana, Calif. 92705

[73] Assignees: Peter J. Balsells; Joan C. Balsells, both of Santa Ana, Calif.

[21] Appl. No.: 298,401

[22] Filed: Jan. 18, 1989

Related U.S. Application Data

[63] Continuation-in-part of Ser. No. 186,016, Apr. 25, 1988, abandoned, and a continuation-in-part of Ser. No. 186,017, Apr. 25, 1988, Pat. No. 4,830,344, and a continuation-in-part of Ser. No. 232,430, Aug. 15, 1988, Pat. No. 4,893,795, and a continuation-in-part of Ser. No. 186,018, Apr. 25, 1988, Pat. No. 4,826,144.

[51] Int. Cl.⁵ .................. F16F 1/34; B60G 11/52; H01B 11/06
[52] U.S. Cl. ................... 267/1.5; 174/35 GC; 267/33; 277/235 R
[58] Field of Search ............... 267/33, 1.5, 167, 168; 277/235 R, 34; 174/35 GC, 35 MS

[56] References Cited

U.S. PATENT DOCUMENTS

| | | | |
|---|---|---|---|
| 1,473,446 | 11/1923 | Scott | 277/163 |
| 1,867,723 | 7/1932 | Adams | 267/167 |
| 2,154,275 | 4/1939 | Linn | 248/358 |
| 2,610,846 | 9/1952 | Hanna | 267/1.5 |
| 2,721,091 | 10/1955 | Pfefferle et al. | 267/168 X |
| 2,859,033 | 11/1958 | Rose | 267/1.5 |
| 3,061,060 | 10/1962 | Stephenson | 192/41 A |
| 3,126,440 | 3/1964 | Goodloe | 174/35 GC |
| 3,183,010 | 5/1965 | Bram | 277/235 |
| 3,323,785 | 6/1967 | Mather | 267/167 |
| 3,468,527 | 9/1969 | Mather | 267/167 |
| 4,655,462 | 4/1987 | Balsells | 277/164 |

FOREIGN PATENT DOCUMENTS

| | | | |
|---|---|---|---|
| WO87/01901 | 3/1987 | PCT Int'l Appl. | 174/35 GC |
| 0372759 | 7/1973 | U.S.S.R. | 174/35 GC |

Primary Examiner—Robert J. Oberleitner
Attorney, Agent, or Firm—Walter A. Hackler

[57] ABSTRACT

An electromagnetic shielding gasket is provided which includes a coil spring for blocking the propagation of electromagnetic waves therepast. The coil spring includes a plurality of individual coils which provide shielding of electromagnetic waves independent of compression of the coil spring within a range of deflection of the individual coils.

42 Claims, 8 Drawing Sheets

FIG. 11a. RADIAL SPRING COMPRESSED AXIALLY TURNED ANGLE 90°

FIG. 11b. AXIAL SPRING TURNED 30° COUNTERCLOCKWISE

FIG. 11c. AXIAL FLAT SPRING

FIG. 11d. AXIAL SPRING TURNED 30° CLOCKWISE

FIG. 11e. AXIAL SPRING TURNED 60° CLOCKWISE

COILED SPRING ELECTROMAGNETIC SHIELDING GASKET

The present application is a continuation-in-part of U.S. Patent Application Ser. No. 186,016 filed Apr. 25, 1988, now abandoned, U.S. Patent Application Ser. No. 186,018 filed Apr. 25, 1988, now U.S. Pat. No. 4,026,144, U.S. Patent Application Ser. No. 186,017 filed Apr. 25, 1988, now U.S. Pat. No. 4,830,344, and U.S. Patent Application Ser. No. 232,430, filed Aug. 15, 1988; now U.S. Pat. No. 4,893,795.

The present invention generally relates to shielding gaskets for interfacing electronic/electromagnetic components, such as filters, attenuators, connectors, circuit boards and other electronic or non-electronic equipment which requires shielding or grounding of such components in order to prevent interference or damage by electromagnetic radiation. More particularly, the invention relates to electrically conductive gaskets for enabling the establishment of component interface without the transmittal or leakage of electromagnetic energy therepast independent of loading forces on the gasket.

It is well known that modern electronic equipment is typically produced in modular form where discreet components or units of electronic equipment are interconnected by cables or the like and where such components themselves are comprised of discreet sub-systems which may be interchanged or replaced for servicing. It is important to realize that in many, if not most instances, all of the modular units as well as the sub-system components are preferably isolated from electromagnetic emanations from either other sub-components within the equipment or from exterior sources. Inefficient coupling of components results in both the loss of operation efficiency, due to the energy loss, and also the interference with effective operation of other associated electronic components.

The problems associated with unwanted electromagnetic energy leakage and interference has been known for some time. The problems are particularly acute for components which must be repeatedly interconnected and disconnected, either to vary the operational characteristics of the equipment, provide for mobility of the equipment, or for maintenance. In these situations, the mechanical and electrical coupling of components many times includes a gasket or the like surrounding critical electromagnetic transmission lines or equipment which is comprised of a conductive elastomer or a combination of elastomeric materials in any number of configurations.

A common type of gasket now being used in such applications is a conductive elastomer, which consists of an elastomeric material, silverplated aluminum composites or similar materials that have a high degree of conductivity, for the purpose of providing effective shielding. Other types of gaskets now in use consist of metallic or metallic combinations in the form of mesh strips in round or rectangular shapes; braided wire in a round or rectangular tubular shape; expanded metals; circular, round strips, etc. These various materials are made from metallic materials or filled with elastomeric materials to provide a higher degree of resiliency.

While many, if not all, of the hereinabove identified gasket configurations provide electromagnetic shielding to a certain extent, each of them have the disadvantage of permanent deformation thereof upon loading. That is, they take a "set" upon loading and thereafter upon a change in such loading create a gap, or separation, which allows the transmission of electromagnetic energy therepast. The hereinabove identified disadvantage described in general terms may be illustrated by a specific example of a screw-type microwave connector which includes an elastomeric gasket which is deformed upon coupling the connector to a component by mechanical threads or the like. Upon either repeated, or intermittent use, the elastomeric member takes a "set" and therefore does not provide reliable electromagnetic shielding upon repeated coupling and uncoupling of the connectors.

This problem becomes more acute when the gasket is subjected to thermocycling. Repeated heating and cooling of the gasket may cause significant relaxation, thereby leaving openings between normally coupled components through which electromagnetic energy can pass through, even though the gasket may not be subject to loading changes due to repeated coupling and uncoupling.

While reference to shielding gaskets, including elastomeric components has been made, it is also well known that other metallic materials such as braided wire, woven gaskets, circular strips or expanded metal, take a set upon loading, are typically very rigid and do not accommodate well to small diameters or irregularities, therefore, enabling the leakage of electromagnetic energy therepast. The irregularities hereinbefore identified include mating components which have surface deformations or surface finishes which do not intimately engage one another, the latter relying on a gasket for providing electrical continuity to a degree necessary to provide electromagnetic shielding for a particular electromagnetic energy frequency.

Regarding the frequency of electromagnetic energy, in particular, microwave bands for commercial service applications generally range from about 100 MHz to about 1 GHz, while military service applications may range from 1 GHz to 300 GHz. Electromagnetic energy as used herein is a generic term including the full spectrum of electromagnetic energy frequencies and specifically as used hereinafter, electromagnetic interference (EMI) and radio frequency interference (RFI) may be used interchangeably, with both referring to interference caused by unwanted electromagnetic energy or radio frequency energy entering a designated piece of equipment. In general, the ability to shield a component from egress or ingress of electromagnetic energy is often called shield effectiveness.

A factor of prime importance in electromagnetic shielding is the frequency of the electromagnetic energy or the wave length thereof. It is known that all electromagnetic waves consist of two essential components, a magnetic field and an electric field. These two fields are perpendicular to each other, and the direction of wave propagation is at right angles to the plane containing these two components. The relative magnitude between the magnet (H) field and the electric (E) field depends on how far away the wave is from its source, and on the nature of the generating source itself. The ratio of E to H is called the wave impedance, $Z_w$.

Thus, it can be seen that shield effectiveness for a particular gasket may differ, depending on whether the electromagnetic energy is generated in associated equipment or in equipment remote from the gasket.

If the source contains a large current flow compared to its potential, such as may be generated by a loop, a transformer, or power lines, it is called a current, magnetic, or low impedance source, having a small E to H value. On the other hand, if the source operates at a high voltage, and only a small amount of current flows, the source impedance is said to be high, and the wave is commonly referred to as an electric field.

It is important to realize that at very large distances from a source, the ratio of E to H to equal for either wave, regardless of its orientation. When this occurs, the wave is said to be a plane wave, and the wave impedance is equal to 377 ohms, which is the intrinsic impedance of free space.

It is known that metals have an intrinsic impedance that approaches zero as conductivity approaches infinity. Because of the great difference between the intrinsic impedance of metals and the intrinsic impedance of free space, waves generated from sources remote from the metal receptor will have most of the energy reflected therefrom and very little will be transmitted therepast. This, of course, is not true for magnetic or low impedance fields, in which less energy is reflected, and more is absorbed thereby making it more difficult to shield against magnetic fields. Because magnetic shields have less than infinite conductivity, part of the field is transmitted across the boundary which is dependent upon the thickness of metallic shield.

A far greater factor in shield effectiveness is the presence of openings or gaps in the shield. A gap or opening in the shield will allow electromagnetic fields to radiate through the shield unless the current continuity can be preserved across the gaps. Therefore, the function of an EMI gasket is to preserve the continuity of current flow in the shield.

The importance of the gap is, of course, dependent upon the frequency of the impinging electromagnetic energy. For example, electromagnetic energy having frequency of one GHz has a wavelength of approximately 11.6 inches, while electromagnetic energy of 100 GHz has a wavelength approaching 0.12 inches. As a general rule, for effective shielding in commercial use, the opening size should be less than the wavelength of the electromagnetic energy divided by 20 and for avionics use the opening size should be less than 1/50th of the wavelength of the electromagnetic energy.

Other factors bearing directly on the gap size and therefore shield effectiveness is the surface finish of mating parts to be sealed, the ability of the shielding material to withstand environmental changes with no or little changes in conductivity, due to corrosion galvanic action, etc. The ability of the gasket to provide dimensional stability with a constant load throughout the life of the gasket between the mating parts is important in order to prevent changes in the continuity of the gasket and to prevent the opening of gaps therein, which may be unacceptable in terms of shield effectiveness.

The gasket of the present invention provides an effective electromagnetic shield through the use of a canted-coil spring with closely spaced coils that deflect upon loading, for providing a nearly constant force between mating points, and/or surfaces, in order to assure a high degree of conductivity, and therefore a high shield effectiveness within useful temperature and cycling requirements. In addition, the gasket of the present invention provides sufficient flexibility to take up for variations that may occur due to torquing, eccentricities, irregularities and other variables, and still maintain the required loading and open low area for effective shieldings from very low frequencies to extremely high frequencies.

SUMMARY OF THE INVENTION

In accordance with the present invention, an electromagnetic shielding gasket includes coil spring means for blocking the propagation of electromagnetic waves therepast with the coil springs means including a plurality of individual coil means for causing the coil spring means to block the propagation of electromagnetic waves therepast independent of compression of the coil spring means within a range of deflection of the individual coil means. The individual coil means are interconnected with one another and disposed in a canted relationship with the centerline of the coil spring means. Because the blockage of electromagnetic wave propagation is independent of the compression of the coil spring means, the gasket enables the mating of irregular surfaces and is independent of spacing variations between the mating surfaces due to temperature effects. More particularly, the electromagnetic sealing gasket, in accordance with the present invention, takes the form of a continuous coil spring when the individual coil means are joined together. Additionally, inner coil spring means may be provided which are disposed within the coil spring means for propagation of electromagnetic waves therepast. The inner coil spring means includes a plurality of individual inner coil means for causing the intercoil spring means to block the propagation of electromagnetic waves therepast independent of compression of the inner coil spring means within a range of deflection of the individual inter coil means. The individual inner coil means may be interconnected with one another and disposed in a canted relationship with a centerline of the canted coil spring means and further may be canted in an opposite direction as the coil means or in the same direction as the coil means.

More particularly, an electromagnetic shielding gasket in accordance with the present invention may include garter-type axially resilient coil spring means for blocking the propagation of electromagnetic waves therepast with the said coil spring means comprising a plurality of individual coil means for canted along a centerline thereof and comprising back angle means for both defining the disposition of a trailing portion of each coil means with respect to a line normal to the centerline and for determining the force-deflection characteristics of the coil spring means. Front angle means may be provided for defining the disposition of a leading portion of each coil means with respect to the normal line and said front angle means is greater than said back angle means. The coil means may be interconnected in the manner forming a garter-type axially resilient coil spring with the trailing portion along an outside diameter of the garter-type axially resilient coil spring and the leading portion along an inside diameter of the garter-type axially resilient coil spring.

In another embodiment, the electromagnetic shielding gasket in accordance with the present invention may include radially resilient canted coil spring means for blocking the propagation of electromagnetic waves therepast which comprise a plurality of individual coil means canted along the centerline thereof and including back angle means for defining the disposition of a trailing portion of each coil means with respect to a line normal to the centerline and front angle means for defining the disposition of a leading portion of each coil means with respect to the normal line. Means are provided orienting the plurality of coil means at a turn angle for defining the load-deflection characteristics of the radially resilient canted coil spring means with said turn angle being greater than 0 degrees and less than 90 degrees.

BRIEF DESCRIPTION OF THE DRAWINGS

The advantages and features of the present invention will appear from the following description when considered in conjunction with the accompanying drawings in which.

DETAILED DESCRIPTION

Figure 1:
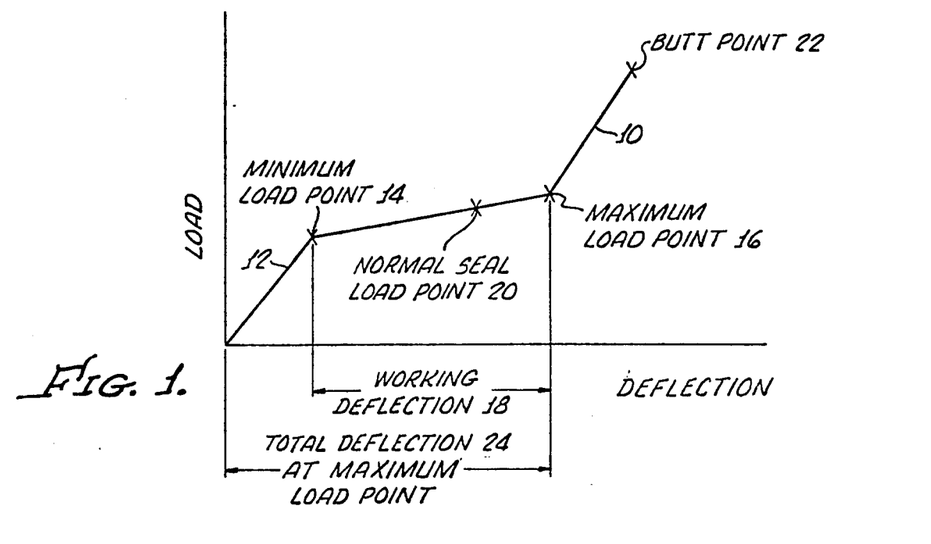
FIG. 1 is a theoretical load versus deflection curve illustrating the various parameters of a resilient coil spring in accordance with the present invention.

Turning now to FIG. 1 there is shown an exemplary load-deflection curve 10 for the purpose of illustrating the characteristics of canted coil resilient coiled springs suitable for electromagnetic shields gasket in accordance with the present invention.

As shown in FIG. 1 when a load is applied to the spring, the spring deflects in a generally linear fashion as shown by the line segment 12 until it reaches a minimum of load point 14 which represents the point at which, after the initial deflection, the load begins to remain relatively constant. It is to be appreciated that for an axially resilient garter-type spring, hereinafter described, the load is applied axially and for a radially resilient garter-type spring, hereinafter described, the load is radially applied.

Between the minimum load point 14 and a maximum load point 16, the load deflection curve may be constant or show a slight increase as shown in FIG. 1. The area between the minimum load point 14 and maximum load point 16 is known as the working deflection range 18. The spring is normally loaded for operation within this range, as indicted by point 20, for a typical spring utilized in conjunction with a seal, gasket, or the like, for both sealing and electromagnetic shielding purposes. Loading of the spring beyond the maximum load point 16 results in an abrupt deflection response until it reaches a butt point 22, which results in a permanent set in the spring as a result of overloading. Also indicated in FIG. 1, is the total deflection range 24, which is defined as the deflection between the unloaded spring and the deflection at the maximum load point 16.

Figure 2A:
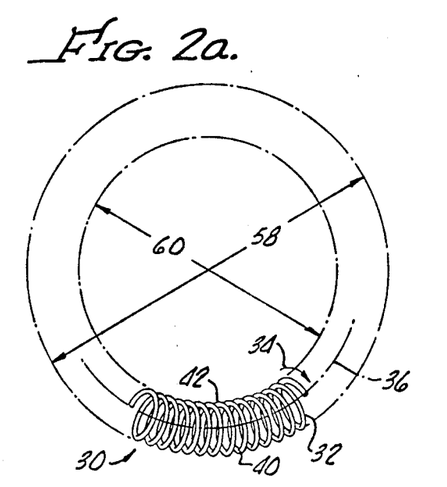
FIGS. 2a and b are plan and side views, respectively, of a circular welded clockwise wound spring with a back angle defining a trailing portion along the outside diameter of the spring and a front angle defining a leading portion along the inside diameter of the spring, in accordance with the present invention.
Figure 2B:
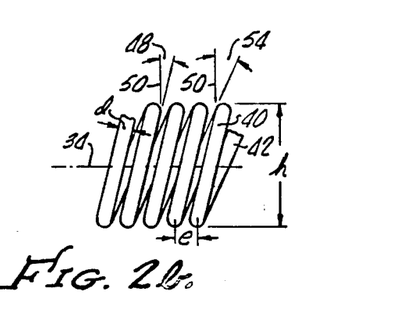

FIGS. 2a and 2b show a circular welded spring 30, in accordance with the present invention, generally showing a plurality of coils 32 wound in a clockwise fashion (see arrow 34) which are canted in a counterclockwise direction along a centerline 36 thereof.

As more clearly shown in FIG. 2b, each coil includes a trailing portion 40 and a leading portion 2, with the trailing portion having a back angle 48 which provides for means for both defining the disposition of the trailing portion 40 of each coil 32 with respect to a normal line 50 and for determining the working resilient range of the spring 30 as hereinafter described in greater detail.

In addition, a front angle 54 provides means for defining the disposition of the leading portion 2 of the coil 32 with respect to the normal line.

The spring 30 is formed by interconnecting the coils 32 in a manner forming a garter-type axially resilient coil spring with the trailing portion 40 along an outside diameter 58 (see FIG. 2a) of the spring 30 and the leading portion 42 along an inside diameter 60 of the spring 30.

As can be seen most clearly in FIG. 2b, the spring 30, in accordance with the present invention, always has a leading portion 40 disposed at a front angle 54, which is greater than the back angle 48 defining the trailing portion 40. That is, as the coil is traced in the circular-like manner about the centerline 32, each revolution includes a trailing portion and a leading portion, with the leading portion advancing movement along the centerline 32 more than the advancement along the centerline 32 when following the trailing portion 40 of the coil 32.

Figure 3A:
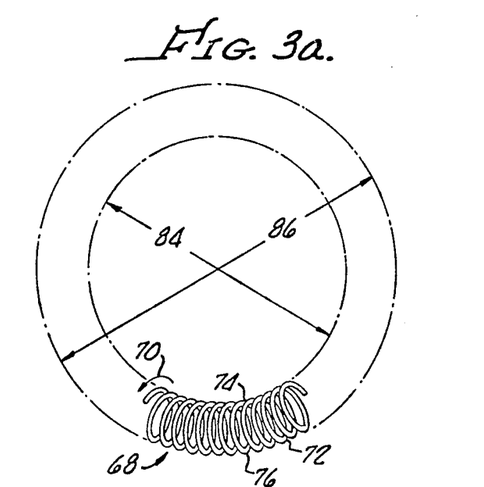
FIG. 3a and b are plan and side views, respectively, of a circular counter-clockwise wound spring having the same physical dimensions as the spring shown in FIG. 2a, 2b, also having a back angle defining a trailing portion along the outside diameter of the spring and a front angle defining a leading portion along an inside diameter of the spring.
Figure 3B:
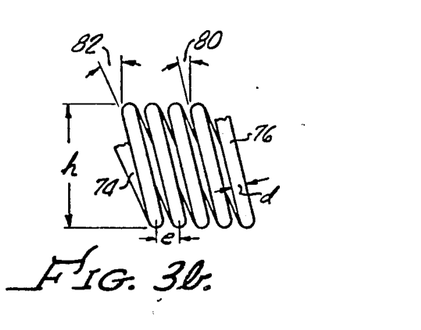

FIGS. 3a and 3b show a circular welded spring 68, in accordance with the present invention, having the same physical dimensions and wire sizes as spring 30, shown in FIGS. 2a and 2b, with the spring 68 wound in a counter-clockwise fashion (see arrow 70). In this instance, the spring 68 includes a plurality of coils 72, each having a trailing portion 74 and a leading portion 76 which are defined, respectively by a back angle 80 and a front angle 82, as shown in FIG. 3b.

Similar to spring 30, the coils 72 of spring 68 are interconnected in a manner forming a garter-type axially resilient coiled spring 68 in which the trailing portion falls along an outside diameter 86 and the leading portion falls along an inside diameter 84 of the spring 68.

Figure 4:
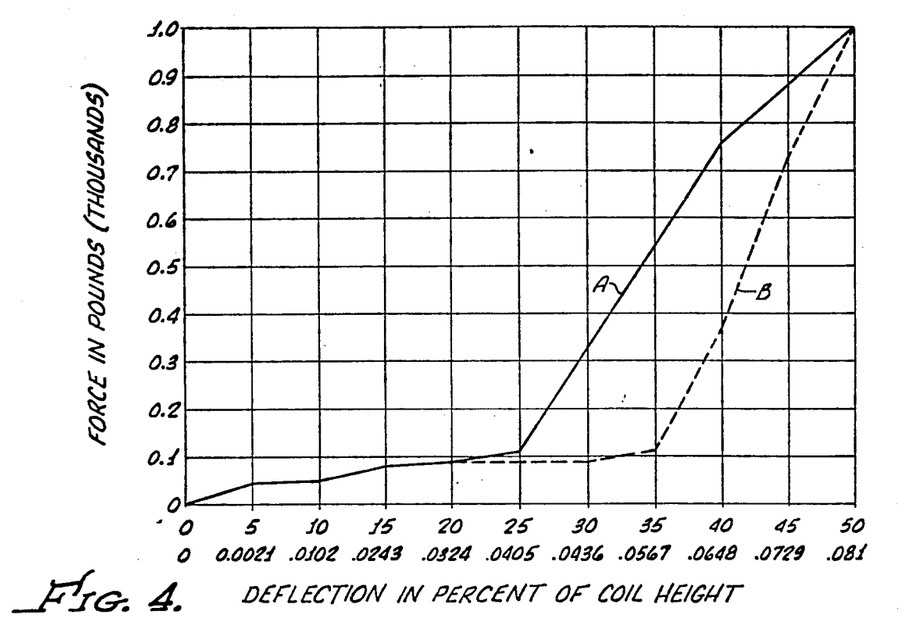
FIG. 4 is a load versus deflection curve for the springs shown in FIGS. 2 and 3.

Curve A of FIG. 4 represents the performance of the spring 30 or 68, while spring B represents the performance of a prior art spring identical in physical specification, but with the trailing portion along the outside of the spring. Although the two springs have almost identical force-deflection characteristics in their working deflection range, the maximum load points have a variation of about 40 percent.

Figure 5:
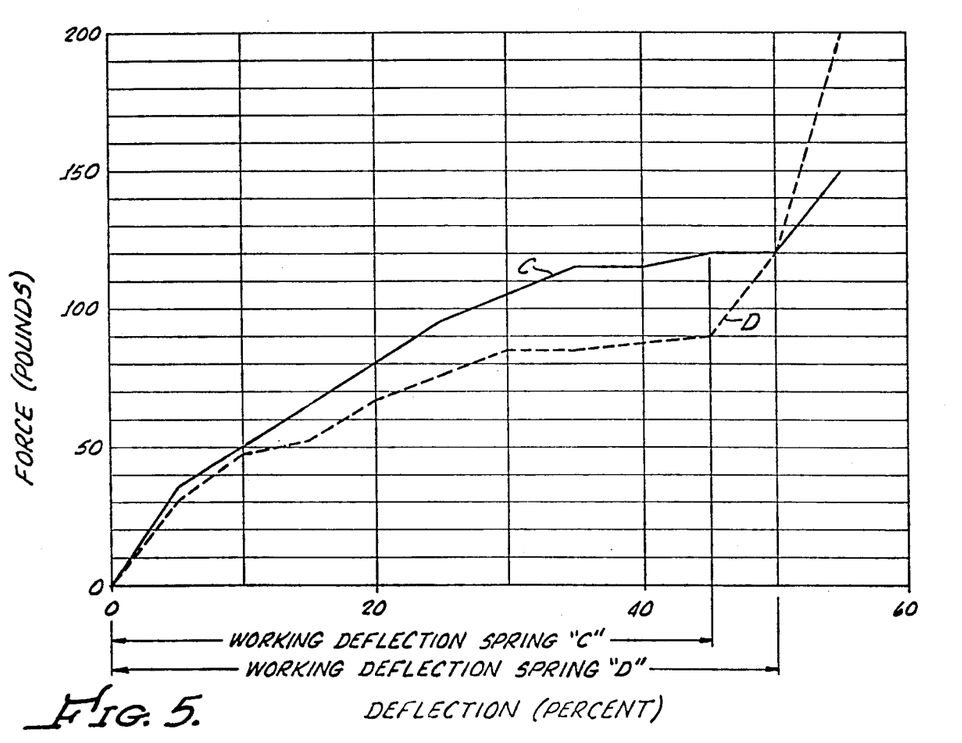
FIG. 5 shows load deflection curves for a variety of axially loaded counterclockwise springs with the trailing portion along the outside diameter thereof corresponding to the spring dimensions set forth in table 1.

It has been found that, in accordance with the present invention, the back angle can be varied from as little as one degree to 35 degrees as long as the front angle 54 is greater than the back angle and is larger than 20 degrees and less than 55 degrees. Variation in the back angle of the spring significantly affects the resilient characteristics of the spring independent of the front angle. This is shown in FIG. 5 which is a force-deflection curve for springs C and D having spring parameters set forth in Table 1. It should be appreciated that the spring parameters set forth herein are provided only to illustrate the effect of spring back angle and disposition of the trailing portion. Actual spring parameters depend upon the desired spring size, loading and application.

Springs C and D are identical springs having the same wire diameter, spring inside diameter coil height and approximately the same front angle, but the back angle and correspondingly the coil spacing is varied. As can be seen in FIG. 5, the working deflection of spring D is approximately 50 percent whereas the working deflection of spring C is 45 percent. This is independent of the front angle. Hence, springs can be designed with varying resilient characteristics, such as the force required to deflect the spring, utilizing a spring having the same wire diameter inside diameter and coil height than was heretofore possible with only varying the front angle of the spring.

TABLE 1

| Spring No. | Wire Dia. (d) (inches) | Spring I.D. (inches) | Coil Height (h) (inches) | Back Angle (degrees) | Front Angle (degrees) | Coil Spacing (inches) |
|---|---|---|---|---|---|---|
| C | 0.022 | 0.840 | 0.161 | 10.5° | 38° | 0.043 |
| D | 0.022 | 0.840 | 0.161 | 16.25° | 38° | 0.032 |

TABLE 2

| Spring No. | Wire Dia. (d) (inches) | Spring I.D. (inches) | Coil Height (h) (inches) | Back Angle (degrees) | Front Angle (degrees) | Coil Spacing (inches) |
|---|---|---|---|---|---|---|
| E | 0.016 | 0.850 | 0.163 | 11° | 21° | 0.016 |
| F | 0.016 | 0.850 | 0.163 | 27° | 38° | 0.016 |
| G | 0.016 | 0.850 | 0.163 | 34° | 45° | 0.016 |

As hereinabove described, increased force-deflection characteristics can be used to advantage in conjunction with a sealant, or gasket materials, wherein the spring cavity is predetermined, the latter dictating spring I.D. and coil height.

Figure 6:
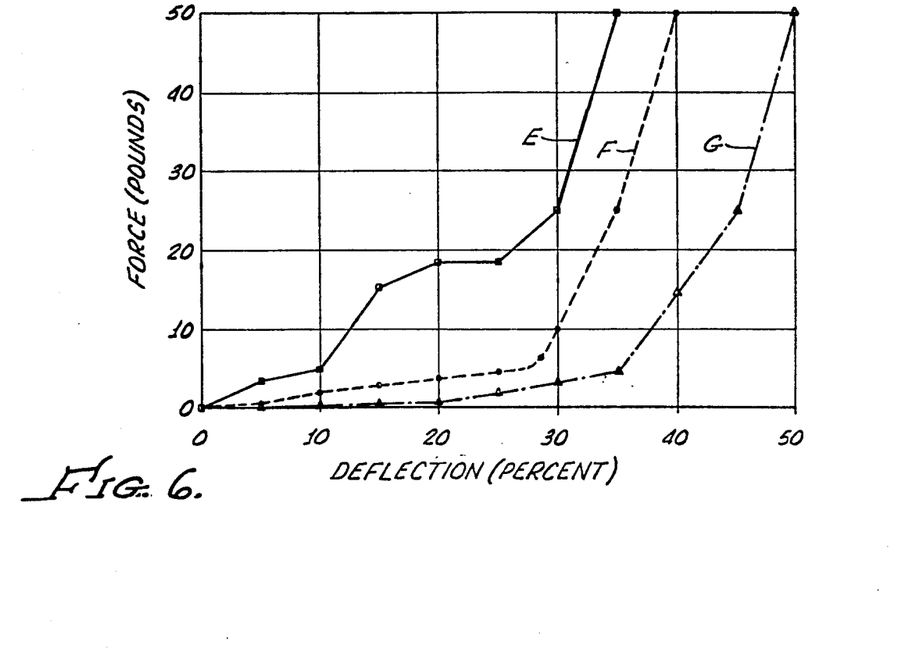
FIG. 6 shows load deflection curves for axially springs having different back angles.

When the coil spacing is held constant, the back angle along with the front angle may be varied to custom design a spring to tailor the resilient characteristics. For example, the smaller the back angle, the higher the force necessary to deflect the spring, as shown in FIG. 6, for Springs E, F and G defined in Table 2. This enables springs to be made with smaller wire and close coil spacing. Conversely, as the back angle is increased, the working deflection is increased when the coil spacing is held constant.

This characteristic is important and enables the coiled spring in accordance with the present invention to be effective as electromagnetic shielding gasket, either by themselves or in conjunction with conductive elastomers as hereinafter described.

Figure 7A:
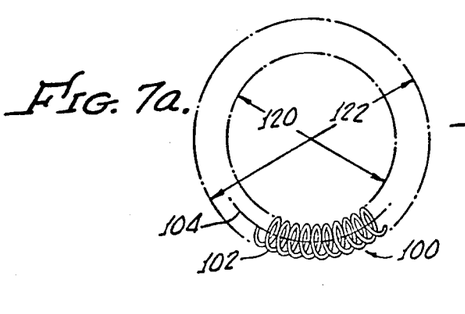
FIG. 7a and b are plan and side views, respectively, of a circular welded clockwise spring, in accordance with the present invention, with a front angle on the outside of the spring and a back angle on the inside of the spring.
Figure 7B:
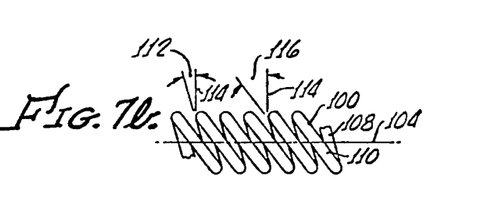

Turning now to FIG. 7a and 7b, there is shown a circular welded clockwise spring 100 in accordance with the present invention, generally showing a plurality of coils 102, which are canted in a clockwise direction along a centerline 104 thereof. As more clearly shown in 2b, each coil 102 includes a trailing portion 108 and a leading portion 110, with the trailing portion having a back angle 112 which provides for means for both defining the orientation of the trailing portion 108 of each coil 102 with respect to a normal line 114 and for determining the working resilient range of the spring 100 as hereinafter described in greater detail.

In addition, a front angle 116 provides the means for defining the orientation of the leading portion 110 of the coil 102 with respect to a normal line 114.

The spring 100 is formed by interconnecting the coils 102 in a manner forming a garter-type axially resilient coil spring with the trailing portion 108 along an inside diameter 120 (see FIG. 7a of the spring 100 and a leading portion 110 along an outside diameter 122 of the spring 100.

As can be seen most clearly in FIG. 7b, the spring 100, in accordance with the present invention, always has a leading portion 110 disposed at a front angle 116, which is greater than the back angle 112, defining the trailing portion 108. That is, as the coil is traced in the circular-like manner about the centerline 104, each revolution includes a trailing portion 108 and a leading portion 110, with the leading portion advancing movement along the centerline 104 more than the advancement along the centerline 104 when following the trailing portion 108 of the coil 102.

It should be appreciated that the inside back angle canted coil spring 100, while having the same general load/deflection characteristics as the outside back angle canted coil spring 30 hereinbefore described, the specific load/deflection characteristics of each spring are different. For example, an outside back angle canted coil spring 30 having the same wire size and dimension as an inside back angle canted coil spring 100 will generally have a higher maximum load point (See FIG. 1) than the inside back angle canted coil spring.

Figure 8:
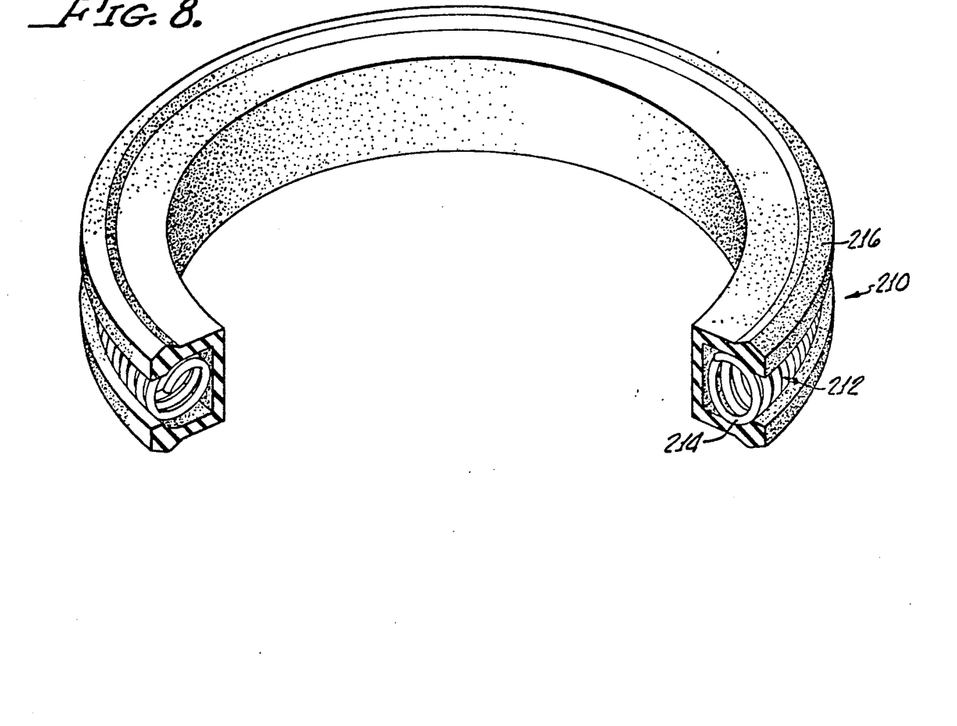
FIG. 8 is a perspective view of an electromagnetic shielding gasket generally including an annular axially resilient coil, in accordance with the present invention, generally showing a plurality of coils interconnected in a manner forming a garter-type axially resilient coil spring, with the spring being disposed in an annular seal with a preselected turn angle orientation for controlling a resilient characteristics of the annular axially resilient coil spring, non-invasive support of the spring within the annular seal enabling independent working of the spring therein, thereby providing preselected force concentration on the sealing portions of the seal.

Turning now to FIG. 8, there is shown an electromagnetic shielding gasket 210 in accordance with the present invention, generally showing a garter-type axial spring 212 with a plurality of coils 214 in an annular seal 216 which provides means for non-invasively supporting the garter-type axially resilient coil spring 212, in a preselected orientation for controlling the resilient characteristics thereof, as hereinafter described in greater detail.

Figure 9:
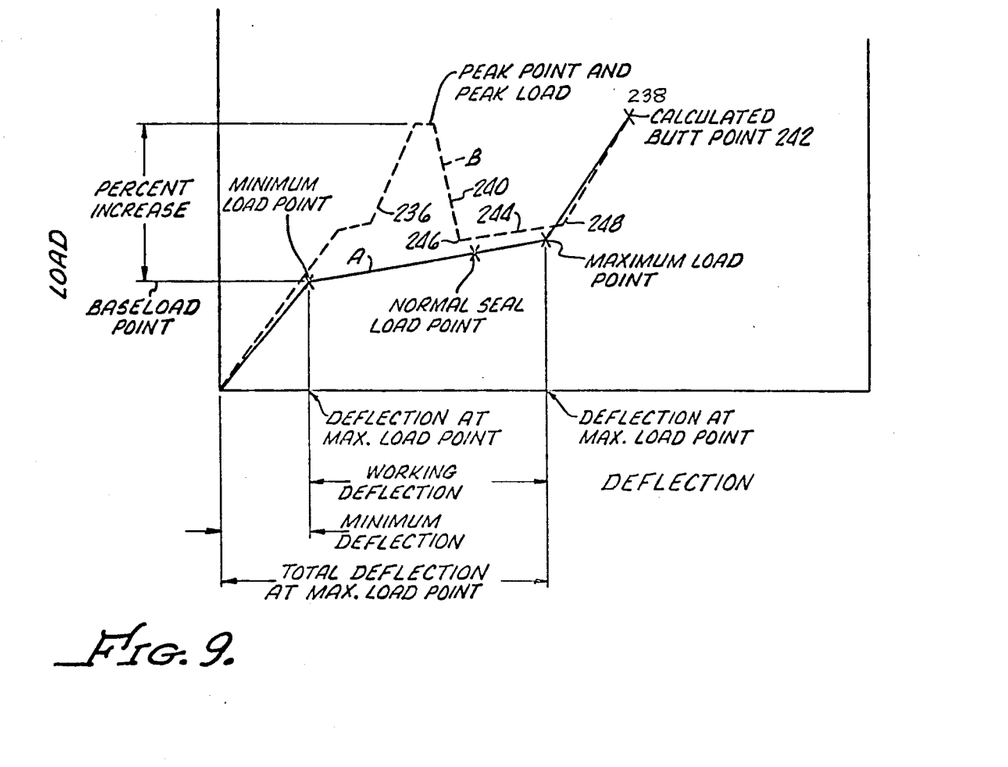
FIG. 9 shows load deflection curves for springs made in accordance with the present invention.

In FIG. 9, there is shown a load-deflection curve A, representative of the hereinbefore discussed spring 30 and 100 for comparison purposes. Also shown is a load-deflection curve B for a spring made in accordance with the present invention having a turn angle for the purpose of illustrating the characteristics thereof.

The load-deflection curve B shows the characteristics of the spring 212 made in accordance with the present invention, showing a linear load-deflection segment 236 until a peak load point 238 is reached. After the peak point 238, the load decreases with deflection in segment 240. This results in a saddle-type deflection range between the peak point 238 and the butt point 242.

This type of load-deflection characteristic may have specific advantage for electromagnetic spring seals which are locked in position, such as a groove, with the tension thereof being caused by the spring. In this instance, while the spring produces a relatively constant load over a given working deflection range 244, changes beyond the working range limits at points 46, 48, causes an abrupt increase in load. This causes the spring seal to be self-centering within a groove, or the like.

Figure 10:
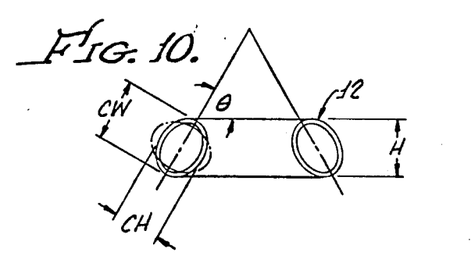
FIG. 10 is a schematic of an axially canted coil spring with turn angle $\theta$ shown for the purpose of illustrating how the turn angle $\theta$ may be calculated.

FIG. 10 shows a schematic form a cross-section of a canted coil spring, in accordance with the present invention, with a turn angle of $\theta$ a measured coil width of CW, a measured coil height of CH and a measured spring height H of the spring 212, as shown in FIGS. 4a, b, c and d. The turn angle may be clockwise (bold lines) or counterclockwise. (Dashed lines).

Figure 11A:
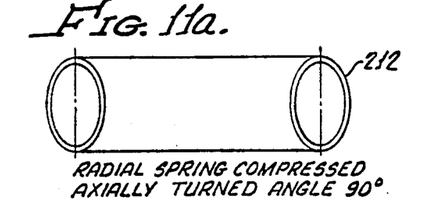
FIGS. 11a, b, c and d and e illustrate axial springs having various turn angles.
Figure 11B:
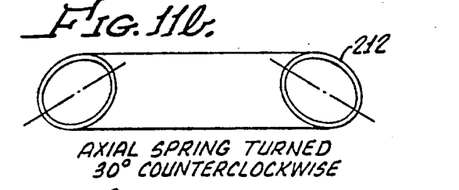
Figure 11C:
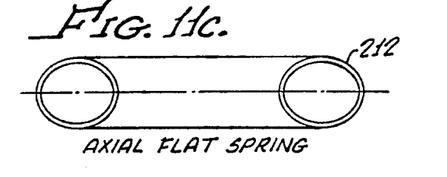
Figure 11D:
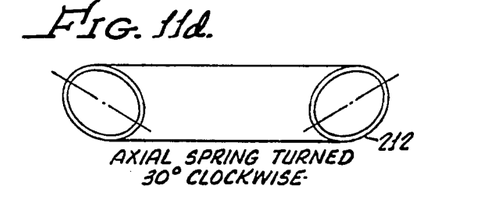

As shown in FIG. 11a, an axially flat spring 212 may be turned up counterclockwise, for example, 30 degrees, as shown in FIG. 11b, or turned clockwise, as for example, shown in FIGS. 11c and 11d, with 30 degrees and 60 degrees turn angles, respectively. It should be appreciated that while the springs shown are shown with a circular shape, other shapes are possible, such as elliptical or rectangular, depending upon the configuration of the mating parts between which the spring 212 and/or seal 216 are to be placed.

As shown in the Figures, the turn angle 0 is defined as an angle formed by a generally circular spring forming a cone or an inverted cone, depending on the position of the spring and measuring the angle $\theta$ from the horizontal to the intersection through the centerline of each cone, or inverted cone. By varying the turn angle $\theta$, different loads can be obtained and the degree of loading depends upon the turn angle $\theta$. That is, the higher the turn angle $\theta$, the higher the force developed, as will be hereinafter demonstrated. It should be noted that the force developed upon loading is independent upon whether the spring is in the cone shape as shown in FIG. 11b, or an inverted cone as shown in 11c. That is the springs in 11b and 11c will perform in identical fashion.

Figure 12:
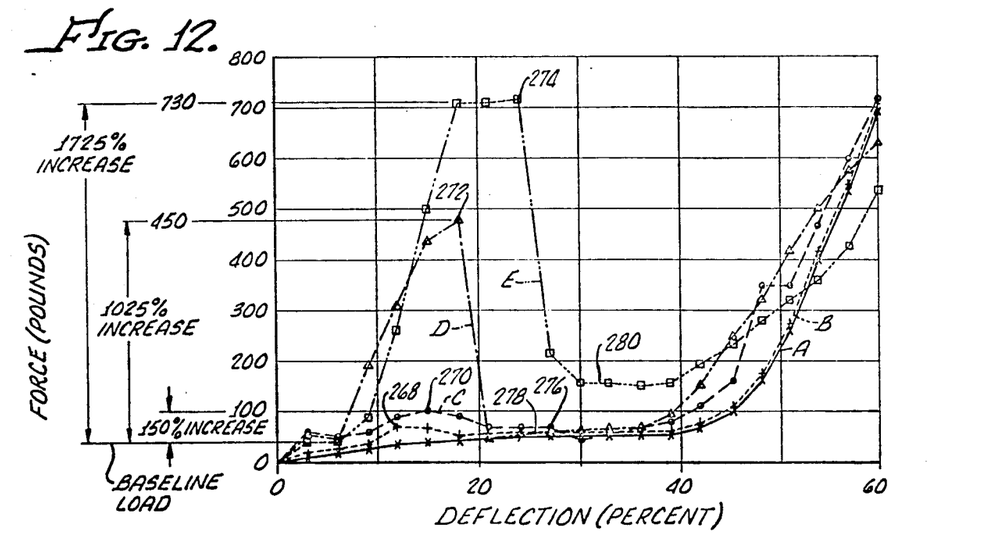
FIG. 12 is a plurality of force-deflection curves, each corresponding to an annular axially resilient coil spring having different turn angle orientation.

Curves A, B, C and D, in FIG. 12 show the force-deflection characteristics of a series of springs, with $\theta$ varied from zero degrees to 90 degrees, with a specification of these springs being set forth in Table 3. Each of the springs A, B, D, D, are identical in all respects, except for the turn angle $\theta$.

Curve A in FIG. 12 represents a spring 212 with a turn angle of zero and is representative of the springs 30 or 100. Curve B represents the spring 212 having a turn angle of 15 degrees and manifests a threshold rise 268 characteristic of springs made in accordance with the present invention. This gradual rise develops into the peak load characteristics more clearly shown by curves C, D and E, corresponding to springs C, D and E of Table 3.

As shown in FIG. 12, as the turn angle $\theta$ increases, the load increases at a maximum about 90 degrees. Importantly, after the peak load, as

TABLE 3

| | | |
|---|---|---|
| Spring Height (CH) = | | 0.163 in. |
| Coil Width (CW) = | | 0.180 in. |
| Turned Height (H) = | | 0.179 in. |
| Wire Diameter (WD) = | | 0.222 in. |
| Coil Spacing = | | 0.018 in. |
| Number of Coils = | | 67 |

| Spring | Turn Angle (deg.) | Peak Load Value (lbs.) | Increase Over Base Load (%) |
|---|---|---|---|
| A | 0 | NA | NA |
| B | 15 | 100 | 100% |
| C | 58 | 100 | 150% |
| D | 76 | 450 | 1025% |
| E | 90 | 730 | 1725% |

TABLE 3-continued

| Spring | #of Coils | Coil Height (in) | Coil Width (in) | Turned Height (in) | Wire Dia. (in) | Turn Angle (deg) | Coil Spring (in) | Trailing Portion |
|---|---|---|---|---|---|---|---|---|
| F | 67 | 0.162 | 0.179 | 0.164 | 0.022 | 32° | 0.018 | Outside diameter |
| G | 67 | 0.162 | 0.179 | 0.164 | 0.022 | 42° | 0.018 | Inside diameter | shown at 270, 272, 274, respectively, is achieved, the force decreases rapidly to approximately the forces shown by springs A and B. Thus, these springs have working regions 276, 278 and 280, approximately the same as unturned spring A; however, as can be seen in FIG. 12, these working areas are bounded by steep load-deflection characteristics. Springs, in accordance with the present invention, have advantages in a variety of applications, as hereinabove described. As hereinbefore mentioned, although the spring shown generally are circular in shape, they could be used in other applications in irregular shapes. That is, the spring will easily fit into other shapes than round.

As shown in Table 3, the peak load is substantially greater than the base load and in fact reaches to 1725 percent when the turn angle is 90 degrees. Hence, by using a turn angle, higher load can be provided. Consequently, as hereinbefore mentioned, a smaller wire can be used which will permit the use of more coils per inch thus decreasing the stress that will occur on the seal when loaded and increase the shielding effectiveness of the gasket 210.

Also, as hereinbefore pointed out, springs, in accordance with the present invention, exhibiting the force-deflection curves as shown buy curve C, D and E of FIG. 12, can be used in self-locking and self-centering applications not heretofore possible by springs exhibiting force-deflection curves as shown by curve A in FIG. 9.

Figure 13:
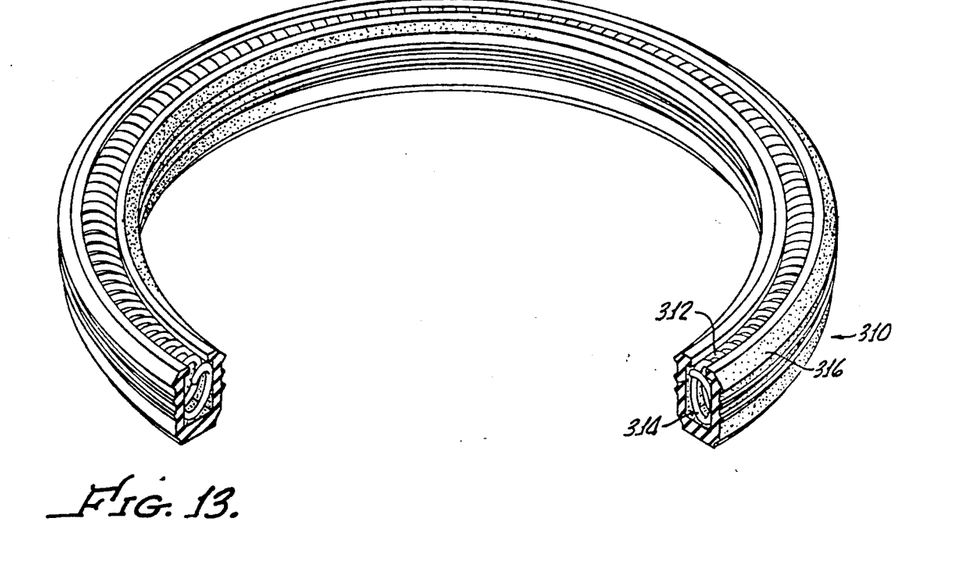
FIG. 13 is a perspective view of an electromagnetic shielding gasket including a radially loaded coiled spring seal, in accordance with the present invention, generally showing a plurality of coils interconnected in a manner forming a radially resilient canted coiled spring, with the spring being disposed in an annular seal with a preselected turn angle orientation for controlling the load-deflection characteristics of the radially resilient canted coiled spring, non-invasive support of the spring within the annular seal enabling independent working of the spring therein, thereby providing preselected force concentration on the sealing portions of the seal.

Turning now to FIG. 13, there is shown an electromagnetic shielding gasket 310 including a radially resilient coiled spring 312, in accordance with the present invention, generally showing the radially resilient spring 312 with a plurality of coils 314 in an annular seal 316 which provides means for non-invasively supporting the garter-type radially resilient coil spring 312, in a preselected orientation for controlling the resilient characteristics thereof, as hereinafter described in greater detail.

The load-deflection curve for the spring 312 is illustrated in FIG. 1.

Figure 14:
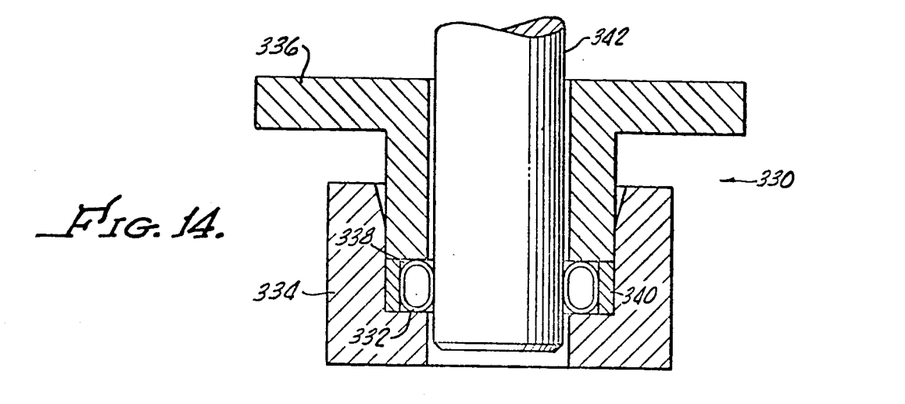
FIG. 14 shows test jig apparatus for the determination of the load deflection characteristics.

The load-deflection characteristics may be determined with a test jig 330 as shown in FIG. 14. A radially resilient spring 332 is held within a housing 334 by a fixture 336, thereby entrapping the spring 332 in a cavity 338. A circumferential spacer 340 is used to load the outside diameter of the spring 332 and the force required to pass a plug 342 through the inside diameter of the spring 332 is measured.

Figure 11E:
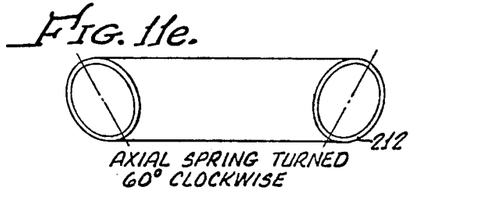

A radially resilient spring 312 may be turned up counterclockwise, as shown in FIGS. 11a, b, c, d and e, for example, 30 degrees, as shown in FIG. 11b, or turned clockwise, as for example, shown in FIGS. 11d and 11e, with 30 degrees and 60 degrees turn angles, respectively. It should be appreciated that while the springs shown are shown with a circular shape other shapes are possible, such as elliptical or rectangular, depending upon the configuration of the mating parts between which the spring 312 and/or seal 316 are to be placed.

As shown in the Figures, the turn angle $\theta$ is defined as an angle formed by a generally circular spring forming a cone or an inverted cone, depending on the position of the spring and measuring the angle $\theta$ from the horizontal to the intersection through the centerline of each cone, or inverted cone. By varying the turn angle $\theta$, different loads can be obtained and the degree of loading depends upon the turn angle $\theta$. That is, the higher the turn angle $\theta$, the higher the force developed, as will be hereinafter demonstrated. It should be noted that the force developed upon loading is independent upon whether the spring is in the cone shape as shown in FIG. 11b, or an inverted cone as shown in 11d. That is, the springs in 11b and 11d will perform in identical fashion.

The spring 312 may also have a trailing portion defined by a back angle and a leading portion defined by a front angle as hereinbefore described.

When loading the spring 312 radially, the load is greater when the turn angle is 90 degrees than when the turn angle is 0 degrees and such load increases progressively from 0 degrees to 90 degrees. In addition, a spring 312 with a back angle, or trailing portion along the inside I.D. of the spring will develop substantially higher force than a spring having a back angle or trailing portion along the outside O.D. of the spring with both springs having the same turn angle.

This enables greater tailoring ability. That is, a greater range of wire size and coil spacing can be used while still exerting the same or greater force in response to deflection. This has significant advantage when the spring is used in conjunction with a seal as hereinbefore described for electromagnetic shielding.

Figure 15:
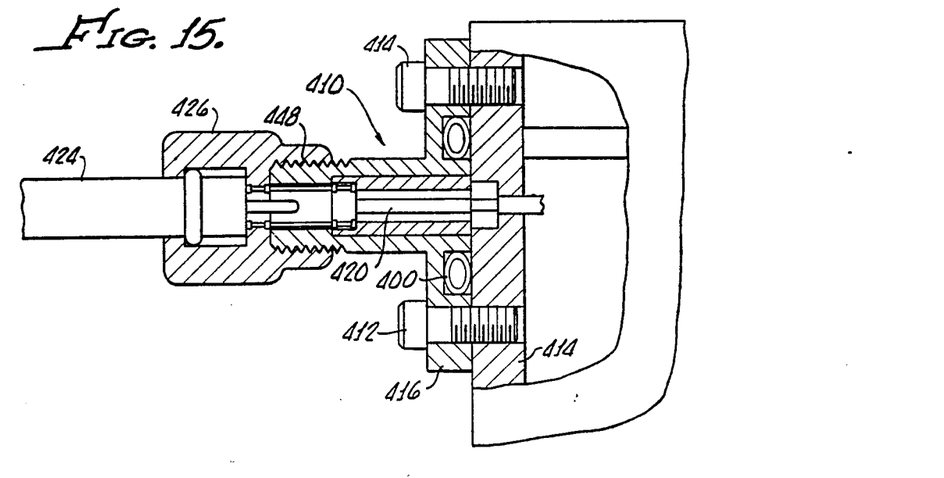
FIG. 15 is a cross-section view of an electromagnetic gasket of the present invention disposed in an RF connector.

With the hereinabove description of various canted coil springs suitable for use as electromagnetic shielding gaskets, the reader's attention is now directed to FIG. 15 which shows a typical application of a gasket shield spring 400 in a coaxial connector 410. In general, the connector 410 is screw 414 mounted to a bulkhead 414 compressing the spring 400 between a connector housing 416 and the bulkhead 414. The connector includes a pin 420 for the transmission of electromagnetic energy. Temporary connection between the connector 410 and a coaxial cable 424 is made through a conventional screw connector 426 with threads 428 disposed on the connector 410.

Figure 16:
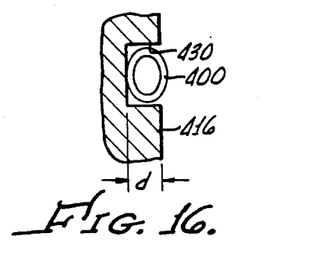
FIG. 16 is an enlarged cross-section view of the gasket shown in FIG. 13 in an unloaded state.
Figure 17:
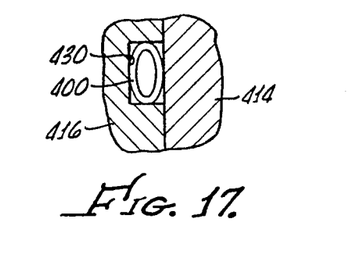
FIG. 17 is an enlarged cross-section view of the gasket shown in FIG. 13 in a load state.

FIGS. 16 and 17 are enlarged views of the housing 416 which includes a groove 430 therein for supporting the spring 400. As shown in FIG. 16, the groove 430 has a depth, d, less than the height of the spring 400, thereby enabling compression of the spring 400 between the housing 416 and bulkhead 414. (FIG. 17). The size and configuration of the spring 400 is made in accordance with the hereinbefore set forth principles to achieve a nearly constant load versus deflection curve for the spring 400. Thus, the spring 400 provides a constant axial force between the housing and the bulkhead 414, despite any variations in the amount of spring compression due to surface irregularities in the groove 430 and the bulkhead 414. Importantly, such force is maintained, despite thermal cycling of the connector which may otherwise deform or assisted permanently setting prior art elastomer seals (not shown) used in a similar configuration.

As a result, the spring 400, which may be formed from any suitable conducting material, maintains electrical continuity within the groove 430 and bulkhead 414 surrounding the conductor 420, thereby blocking the propagation of electromagnetic waves therepast.

Figure 18:
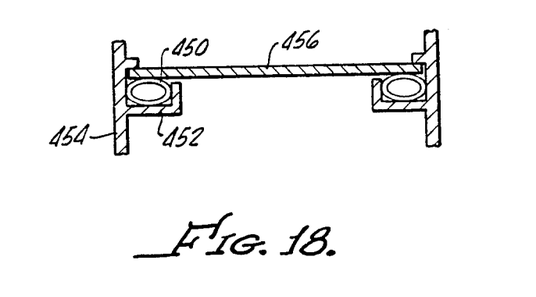
FIG. 18 is a cross-section view of another electromagnetic shield gasket application showing the mounting of a card in a frame.

Turning to FIG. 18, there is shown another application of a gasket 450 made in accordance with the present invention according to the principles hereinbefore discussed. In this instance, a spring 450 may be of general circular shape or any other configuration such as rectangular and is supported in a shelf 452 attached to a frame 454 in a manner enabling the spring 450 to support a sliding card 456 which must be electromagnetically shielded and grounded to the frame 454 and locked into position.

Figure 19:
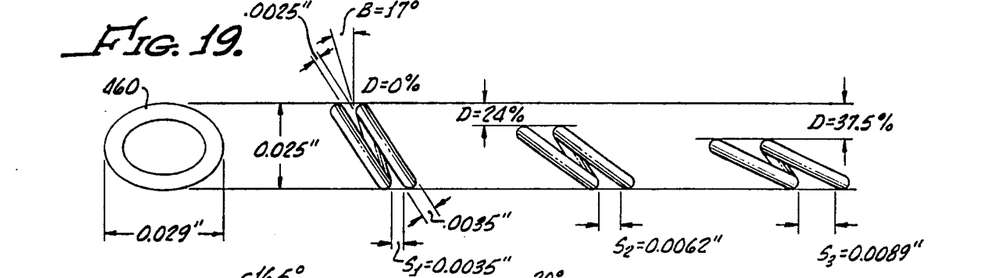
FIG. 19 is a diagram showing the effect of spring deflection on open areas of a canted coil spring.

As hereinbefore discussed, open areas in an electromagnetic shield can provide a source for leakage. However it is not the area or opening itself which determines the amount of leakage from a shield discontinuity but the maximum liner dimension of the area or opening. With this in mind, coils and springs made in accordance with the present invention are selected in order that open areas between coils upon deflection is within that permissible in a particular application. It should be appreciated that this spacing is, of course, dependent upon the wave length of electromagnetic energy to be shielded. With that in mind, FIG. 19 shows a variation in open areas between coils with a change in deflection of a shield gasket spring 60. Typical dimensions are provided on the Figure for the spring 460 which includes a back angle B of 17 degrees, a wire diameter of 0.0035 inches. A spring height of 0.025 inches and a spring with 0.029 inches. FIG. 19 shows that at 0, deflection, D, the open area is 0.0035 inches, while at a deflection of 24 percent, the open area is 0.0062 inches and with a deflection of 37½ percent deflection is 0.0089 inches.

Figure 20A:
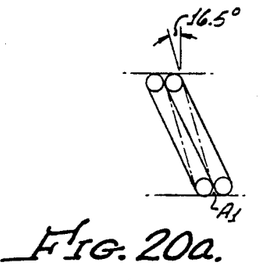
FIG. 20a and b are side views of a coil spring showing the dependence of open area size on the coil back angle.
Figure 20B:
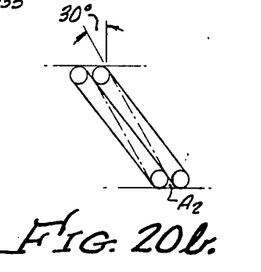

It should also be appreciated that the back angle of the spring has an effect on the open area of the spring. This is illustrated in FIGS. 20a and b, wherein a spring having a height of 0.162 inches and a wired diameter of 0.022 inches has an open area $A_1$ of 0.0000623 sq. inches with a back angle of 16.5 degrees and an open area $A_2$ of 0.0000893 sq. inches with a back angle of 30 degrees.

Figure 21A:
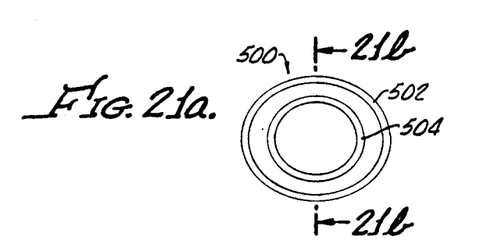
FIG. 21a and b are views of an electromagnetic shield gasket having two canted coil springs in an unloaded state.
Figure 21B:
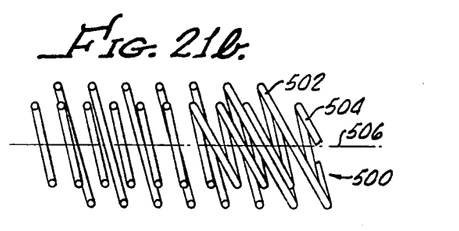
Figure 22A:
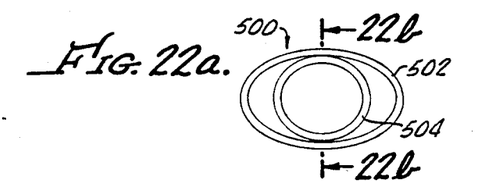
FIG. 22a and b are views of an electromagnetic shield gasket having two canted coil spring in a loaded state.
Figure 22B:
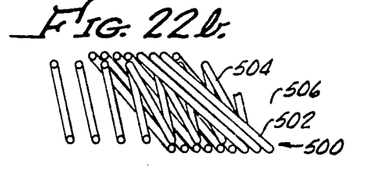

The situations where additional electromagnetic shielding is desired, an electromagnetic shielding gasket 500 as shown in FIGS. 21a and b may include an outer coil spring 502 with an inner coil spring 504 disposed therein, both coil springs 502 and 504 may be made into axially resilient or radially resilient springs as hereinbefore discussed and have their coils canted along a same direction along a centerline 506 or in opposite directions (see, FIG. 22a and b). FIGS. 22a and 22b show the gasket 500 as it may be loaded compressing the outer spring 502 to a position where it contacts the inner coil 504.

Figure 23A:
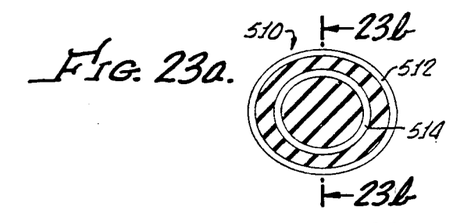
FIG. 23a and b are views of an electromagnetic shield gasket having two coil springs with interstitial areas filled with an elastomer.
Figure 23B:
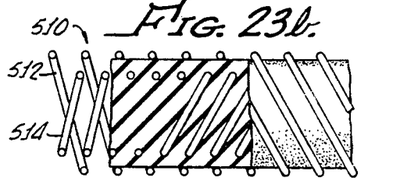
Figure 24A:
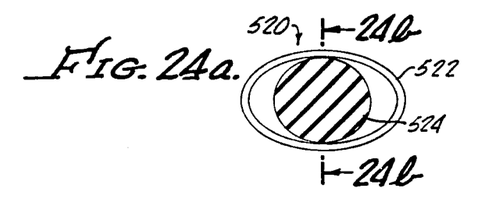
FIG. 24a and b are views of an electromagnetic shield gasket having a coil spring and a central rod or tube.
Figure 24B:
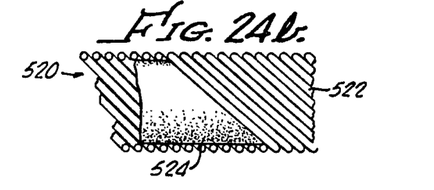

Alternative embodiments of the present invention are shown in FIGS. 23a and b and 24a and b, wherein the electromagnetic shield 510 includes one or more coiled springs 512, 514 which are filled with a conductive elastomer in order to provide further conductivity of the gasket 510. The gasket 520 shown in FIGS. 24a, 24b, includes a coil spring 522 as hereinbefore described with a center rod or tube 524 therein. The rod or tube 524 may be conductive to an electromagnetic shielding and also may be solid with sufficient strength to act as a stop for the spring 522 in order to prevent permanent damage thereto.

Although there has been described hereinabove a specific electromagnetic shielding gaskets in accordance with the present invention for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the invention as defined in the appended claims.

What is claimed is:

1. An electromagnetic shielding gasket comprising: coil spring means for blocking the propagation of electromagnetic waves therepast, said coil spring means comprising a plurality of individual coil means for causing the coil spring means to block the propagation of electromagnetic waves therepast independent of compression of the coil spring means within a range of deflection of the individual coil means, said individual coil means being interconnected with one another and disposed in a canted relationship with a centerline of the coil spring means.

2. The electromagnetic shielding gasket according to claim 1 wherein two ends of the individual coil means are joined to form a continuous coil spring means.

3. The electromagnetic shielding gasket according to claim 1 further comprising inner coil spring means, disposed within the coil spring means, for blocking the propagation of electromagnetic waves therepast.

4. The electromagnetic shielding gasket according to claim 3 wherein the inner coil spring means comprises a plurality of individual inner coil means for causing the inner coil spring means to block the propagation of electromagnetic waves therepast independent of compression of the inner coil spring means within a range of deflection of the individual inner coil means, said individual inner coil means being interconnected with one another and disposed in a canted relationship with the centerline of the canted coil spring means.

5. The electromagnetic shielding gasket according to claim 4 wherein the coil means and inner coil means are canted in the same direction with respect to the centerline.

6. The electromagnetic shielding gasket according to claim 4 wherein the coil means and inner coil means are canted in opposite directions with respect to the centerline.

7. An electromagnetic shielding gasket comprising: coil spring means for blocking the propagation of electromagnetic waves therepast, said coil spring means comprising a plurality of individual coil means for causing the coil spring means to block the propagation of electromagnetic waves therepast, independent of compression of the coil spring means within a range of deflection of the individual coil means, said individual coil means being interconnected with one another and disposed in a canted relationship with a centerline of the coil spring means, each said individual coil means having a trailing portion and a leading portion, said trailing portion being disposed at a back angle with the centerline and said leading portion being disposed at a front angle with the centerline, said front angle being greater than said back angle.

8. The electromagnetic shielding gasket according to claim 7 wherein said individual coil means abut one another.

9. The electromagnetic shielding gasket according to claim 7 wherein said back angle is selected in order that the coil spring means exerts a force in response to deflection of the individual coil means and said force is generally constant over said range of deflection of the individual coil means.

10. The electromagnetic shielding gasket according to claim 9 wherein said back angle is less than about 25 degrees.

11. The electromagnetic shielding gasket according to claim 10 wherein two ends of the individual coil means are joined to form a continuous coil spring means.

12. The electromagnetic shielding gasket according to claim 11 wherein the individual coil means are disposed in a manner forming an axially resilient electromagnetic shielding gasket.

13. The electromagnetic shielding gasket according to claim 12 wherein said trailing portion of each individual coil means is disposed along an outside diameter of the axially resilient electromagnetic shielding gasket and the leading portion of each individual coil means is disposed along an inside diameter of the axially resilient electromagnetic shielding gasket.

14. The electromagnetic shielding gasket according to claim 13 wherein said trailing portion of each individual coil means is disposed along an inside diameter of the axially resilient electromagnetic shielding gasket and the leading portion of each individual coil means is disposed along an outside diameter of the axially resilient electromagnetic shielding gasket.

15. The electromagnetic shielding gasket according to claim 12 further comprising means orienting said individual coil means at a turn angle for defining the load-deflection characteristics of the axially resilient electromagnetic shielding gasket, said turn angle being greater than zero degrees and less than 90 degrees.

16. The electromagnetic shielding gasket according to claim 11 wherein the individual coil means are disposed in a manner forming a radially resilient electromagnetic shielding gasket.

17. electromagnetic shielding gasket according to claim 16 further comprising means orienting said individual coil means at a turn angle for defining the load deflection characteristics of the radially resilient electromagnetic shielding gasket, said turn angle being greater than zero degrees and less than 90 degrees.

18. The electromagnetic shielding gasket according to claim 17 wherein said back and front angles are selected to enable the canted coil spring means to exert a constant force over the range of deflection.

19. An electromagnetic shielding gasket comprising:
coil spring means for blocking the propagation of electromagnetic waves therepast, said canted coil spring means comprising:
a plurality of individual outer coil means for causing the coil spring means to block the propagation of electromagnetic waves therepast independent of compression of the coil spring means within a range of deflection of the individual outer coil means, said individual outer coil means being interconnected with one another and disposed in a canted relationship with a centerline of the coil spring means, each said individual outer coil means having a back portion disposed at an outer coil means back angle with said centerline and a forward portion disposed at an outer coil means front angle with said centerline, said outer coil means front angle being greater than said outer coil means back angle; and,
a plurality of individual inner coil means, disposed within said individual outer coil means, for causing the coil spring means to block the propagation of electromagnetic waves therepast independent of compression of the coil spring means within a range of deflection of the individual inner coil means, said individual inner coil means being interconnected with one another and disposed in a canted relationship with the centerline of the coil spring means, each said inner coil means having a back portion disposed at an inner coil means back angle with said centerline and a forward portion disposed at an inner coil means front angle with said centerline, said inner coil means front angle being greater than said inner coil means back angle.

20. The electromagnetic shielding gasket according to claim 19 wherein said inner and outer coil means are canted in the same direction in relationship with the centerline.

21. The electromagnetic shielding gasket according to claim 19 wherein said inner and outer coil means are canted in opposite directions in relationship with the centerline.

22. The electromagnetic shielding gasket according to claim 19 wherein two ends of the outer coil means are interconnected and two ends of the inner coil means are interconnected to form a continuous coil spring means having continuous inner coil means disposed within continuous outer coil means.

23. The electromagnetic shielding gasket according to claims 22 wherein interstitial areas within the inner and outer coil means are filled with a conductive elastomer.

24. An electromagnetic shielding gasket comprising:
garter-type axially resilient coil spring means for blocking the propagation of electromagnetic waves therepast, said coil spring means comprising a plurality of individual coil means for causing the coil spring means to block the propagation of electromagnetic waves therepast independent of compression of the coil spring means within a range of deflection of the individual coil means, said individual coil means being canted along a centerline thereof and comprising;
back angle means for both defining the disposition of a trailing portion of each coil means with respect to a line normal to the centerline and for determining the force-deflection characteristics of the coil spring means;
front angle means for defining the disposition of a leading portion of each coil means with respect to the normal line, said front angle means being greater than said back angle means; and
said coil means being interconnected in a manner forming a garter-type axially resilient coiled spring with the trailing portion along an outside diameter of the garter-type axially resilient coiled spring and the leading portion along an inside diameter of the garter-type axially resilient coiled spring.

25. The electromagnetic shielding gasket according to claim 24 wherein the back angle means is greater than about one degree and less than about 40 degrees and the front angle means is greater than about 15 degrees and less than about 55 degrees.

26. The electromagnetic shielding gasket according to claim 24 wherein the back angle means defines a working deflection in which the garter-type axially resilient electromagnetic shielding spring gasket exerts a generally constant force in an axial direction in response to deflection of the spring gasket in the axially direction, said working deflection being between about 5 percent and about 50 percent deflection of the spring gasket.

27. An electromagnetic shielding gasket comprising:
garter-type axially resilient coil spring means for blocking the propagation of electromagnetic waves therepast, said coil spring means comprising a plurality of individual coil means for causing the coil spring means to block the propagation of electromagnetic waves therepast independent of compression of the coil spring means within a range of deflection of the individual coil means, said individual coil means being canted along a centerline thereof and comprising;
back angle means for both defining the disposition of a trailing portion of each coil means with respect to a line normal to the centerline and for determining the working resilient range of the coil spring means;
front angle means for defining the disposition of a leading portion of each coil means with respect to the normal line, said front angle means being greater than said back angle means; and
said coil means being interconnected in a manner forming a garter-type axially resilient coiled spring with the trailing portion along an inside diameter of the garter-type axially resilient coiled spring and the leading portion along an outside diameter of the garter-type axially resilient coiled spring.

28. The electromagnetic shielding gasket according to claim 27 wherein the front angle is less than 35 degrees.

29. The electromagnetic shielding gasket according to claim 28 wherein the plurality of coils are canted in a clockwise direction.

30. The electromagnetic shielding gasket according to claim 28 wherein the back angle is greater than one degree and less than 35 degrees.

31. The electromagnetic shielding gasket according to claim 30 wherein the back angle means defines a working deflection in which the spring gasket exerts a generally constant force in an axial direction in response to deflection of the spring gasket in the axial direction, said working deflection being between about percent and about 50 percent deflection of the spring gasket.

32. The electromagnetic shielding gasket according to claim 28 wherein the back angle is less than about 11 degrees.

33. An electromagnetic shielding gasket comprising:
annular axially resilient coil spring means for blocking the propagation of electromagnetic waves therepast, said coil spring means comprising a plurality of individual coil means for causing the coil spring means to block the propagation of electromagnetic waves therepast independent of compression of the coil spring means within a range of deflection of the individual coil means, said individual coil means being canted along a centerline thereof and comprising;
back angle means for both defining the disposition of a trailing portion of each coil means with respect to a line normal to the centerline and for determining the load-deflection characteristics of the coiled spring means;
front angle means for defining the disposition of a leading portion of each coil means with respect to the normal line, said front angle means being greater than said back angle means;
said coil means being interconnected in a manner forming a garter-type axially resilient coiled spring; and
annular seal means for non-invasively supporting the garter-type axially resilient coiled spring in a preselected orientation for controlling the resilient characteristics thereof.

34. The electromagnetic shielding gasket according to claim 33 wherein said annular seal means includes means defining a cavity for supporting and orienting coiled spring with a turn angle of greater than zero degrees and less than 90 degrees.

35. The electromagnetic shielding gasket according to claim 34 wherein the turn angle is selected to provide a load-deflection characteristics having a saddle shape.

36. The electromagnetic shielding gasket according to claim 35 wherein the turn angle is greater than about 15 degrees.

37. The electromagnetic shielding gasket according to claim 35 wherein the turn angle is greater than about 60 degrees.

38. The electromagnetic shielding gasket according to claim 35 wherein the trailing portion is disposed along an outside diameter of the garter-type axially resilient coiled spring and the leading portion is disposed along an inside diameter of the garter-type axially resilient coiled spring.

39. The electromagnetic shielding gasket according to claim 35 wherein the leading portion is disposed along an inside diameter of the garter-type axially resilient coiled spring and the leading portion is disposed along an outside diameter of the garter-type axially resilient coiled spring.

40. An electromagnetic shielding gasket comprising:
radially resilient canted coil spring means for blocking the propagation of electromagnetic waves therepast, said coil spring means comprising a plurality of individual coil means for causing the coil spring means to block the propagation of electromagnetic waves therepast independent of compression of the coil spring means within a range of deflection of the individual coil means, said individual coil means being canted along a centerline thereof and comprising;
back angle means for defining the disposition of a trailing portion of each coil means with respect to a line normal to the centerline;
front angle means for defining the disposition of a leading portion of each coil means with respect to the normal line, said front angle means being greater than said back angle means; and
means orienting said plurality of coils at a turn angle for defining the load-deflection characteristics of the radially resilient canted coiled spring means, said turn angle being greater than zero degrees and less than 90 degrees.

41. The electromagnetic shielding gasket according to claim 40 wherein the trailing portion is disposed along an outside diameter of the radially loaded canted coiled spring and the leading portion is disposed along an inside diameter of the radially resilient canted coiled spring.

42. The electromagnetic shielding gasket according to claim 40 wherein the trailing portion is disposed along an inside diameter of the radially loaded canted coiled spring and the leading portion is disposed along an outside diameter of the radially resilient canted coiled spring.

* * * * *